(12) United States Patent
Jung et al.

(10) Patent No.: US 8,689,150 B2
(45) Date of Patent: Apr. 1, 2014

(54) METHOD OF FABRICATING SEMICONDUCTOR DEVICE

(75) Inventors: Jee-eun Jung, Yongin-si (KR); Kyoung-yun Baek, Suwon-si (KR); Seong-woon Choi, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 28 days.

(21) Appl. No.: 13/406,655

(22) Filed: Feb. 28, 2012

(65) Prior Publication Data

US 2012/0220058 A1    Aug. 30, 2012

(30) Foreign Application Priority Data

Feb. 28, 2011    (KR) .................. 10-2011-0018015

(51) Int. Cl.
*G06F 17/50*   (2006.01)

(52) U.S. Cl.
USPC .................. 716/54; 716/50; 716/51; 716/52; 716/53; 716/55; 430/5; 430/30

(58) Field of Classification Search
USPC ..................... 716/50–55; 430/5, 30
See application file for complete search history.

(56) References Cited

U.S. PATENT DOCUMENTS

| | | | |
|---|---|---|---|
| 6,388,736 B1 * | 5/2002 | Smith et al. ..................... | 355/53 |
| 7,537,870 B2 * | 5/2009 | Crouse et al. ................... | 430/30 |
| 7,560,199 B2 * | 7/2009 | Tan et al. .......................... | 430/5 |
| 8,352,891 B2 * | 1/2013 | Reid et al. ....................... | 716/55 |
| 2007/0067752 A1 | 3/2007 | Moon | |
| 2010/0102255 A1 | 4/2010 | Tsujita et al. | |
| 2010/0251202 A1 * | 9/2010 | Pierrat ............................ | 716/20 |

FOREIGN PATENT DOCUMENTS

| | | |
|---|---|---|
| JP | 2010-109088 A | 5/2010 |
| KR | 10-2006-0105847 A | 10/2006 |
| KR | 10-0642417 B1 | 10/2006 |
| KR | 10-2007-0093554 A | 9/2007 |

* cited by examiner

*Primary Examiner* — Nghia Doan
(74) *Attorney, Agent, or Firm* — Lee & Morse, P.C.

(57) ABSTRACT

A method of fabricating a semiconductor device includes preparing a layout of the semiconductor device, obtaining contrast of an exposure image of the layout through a simulation under a condition of using a crosspole illumination system, separating the layout into a plurality of sub-layouts based on the contrast of the exposure image, forming a photomask having a mask pattern corresponding to the plurality of sub-layouts, and performing an exposure process using the photomask under an exposure condition of using a dipole illumination system.

19 Claims, 14 Drawing Sheets

FIG. 7
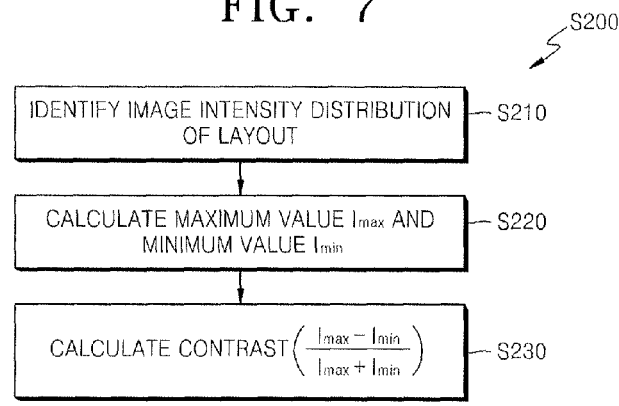
FIG. 8
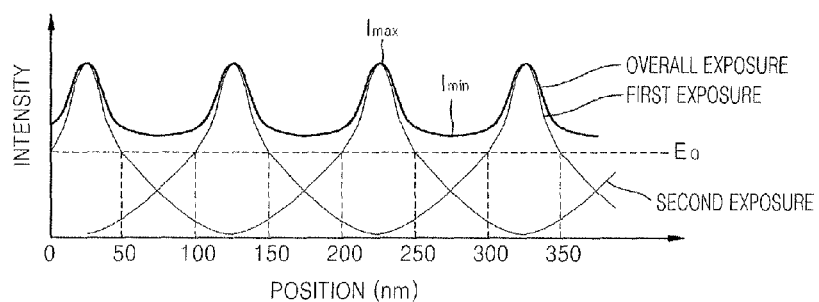
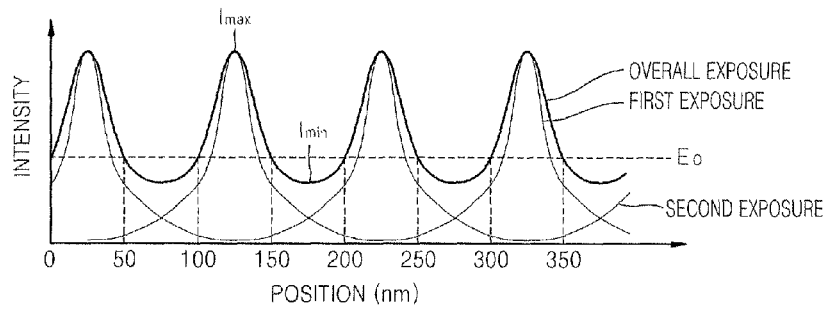

METHOD OF FABRICATING SEMICONDUCTOR DEVICE

CROSS-REFERENCE TO RELATED APPLICATIONS

This application claims the benefit of Korean Patent Application No. 10-2011-0018015, filed on Feb. 28, 2011, in the Korean Intellectual Property Office, and entitled, "Method of Fabricating Semiconductor Device," is incorporated herein in its entirety.

BACKGROUND

1. Field

The present inventive concept relates to a method of fabricating a semiconductor device, and more particularly, to a method of fabricating a semiconductor device in which a photomask is formed by separating a layout of the semiconductor device and the photomask is exposed to light.

2. Description of the Related Art

As photolithography technology develops, a decrease in the scale of an integrated circuit is accelerated. Accordingly, there is a demand to improve a method of fabricating a semiconductor device in which a photomask is formed by processing a layout of the semiconductor and the photomask is exposed to light on a wafer.

SUMMARY

The inventive concept provides a method of fabricating a semiconductor device in which a photomask is formed and exposed by effectively processing a layout of the semiconductor device.

According to an aspect of the inventive concept, there is provided a method of fabricating a semiconductor device which includes preparing a layout of the semiconductor device, obtaining contrast of an exposure image of the layout through a simulation under a condition of using a crosspole illumination system, separating the layout into a plurality of sub-layouts based on the contrast of the exposure image, forming a photomask with a mask pattern corresponding to the plurality of sub-layouts, and exposing the photomask on a wafer under an exposure condition of using a dipole illumination system.

Obtaining contrast of the exposure image of the layout through a simulation may include obtaining a distribution of intensity of the exposure image of the layout, obtaining a maximum value and a minimum value of the intensity of the exposure image, and obtaining a ratio of a difference between the maximum value and the minimum value to a sum of the maximum value and the minimum value.

Obtaining contrast of the exposure image may include using as the exposure image any one of an aerial image, a resist-in image, an exposed resist-in latent image, a post-exposure bake image, and a developed resist image.

Obtaining contrast of the exposure image of the layout through a simulation may include performing under a single exposure condition using the crosspole illumination system.

Exposing the photomask on the wafer may include performing under a double exposure condition using the dipole illumination system.

Separating the layout into a plurality of sub-layouts may include separating the layout into a first sub-layout and a second sub-layout, such that the contrast of the exposure image is greater than a critical value in the first sub-layout and the contrast of the exposure image is smaller than the critical value in the second sub-layout.

Separating the layout into the plurality of sub-layouts may further include separating the second sub-layout into a third sub-layout and a fourth sub-layout, such that the third sub-layout includes a sub-layout extending in a horizontal direction and the fourth sub-layout includes a sub-layout extending in a vertical direction.

Forming the photomask may include forming a first photomask to include a first mask pattern corresponding to the first sub-layout and the third sub-layout, and forming a second photomask to include a second mask pattern corresponding to the first sub-layout and the fourth sub-layout.

Exposing the photomask on the wafer may include exposing the first photomask on the wafer under an exposure condition of using a Y-dipole illumination system, and exposing the second photomask on the wafer under an exposure condition of using an X-dipole illumination system.

Exposing the photomask on the wafer may include coating a resist layer on the wafer, exposing the first photomask on the resist layer under an exposure condition of using the Y-dipole illumination system, exposing the second photomask on the resist layer under an exposure condition of using the X-dipole illumination system, and developing the resist layer that is exposed using the first and second photomasks.

Exposing the photomask on the wafer may include coating a first resist layer on the wafer, exposing the first photomask on the first resist layer under an exposure condition of using the Y-dipole illumination system, developing the first resist layer that is exposed using the first photomask, coating a second resist layer on the wafer, exposing the second photomask on the second resist layer under an exposure condition of using the X-dipole illumination system, developing the second resist layer that is exposed using the second photomask.

Forming a photomask may include forming a third photomask including a third mask pattern corresponding to the first sub-layout, forming a fourth photomask including a fourth mask pattern corresponding to the third sub-layout, and forming a fifth photomask including a fifth mask pattern corresponding to the fourth sub-layout.

Exposing the photomask on the wafer may include exposing the third photomask on the wafer under an exposure condition of using the X-dipole illumination system and the Y-dipole illumination system, exposing the fourth photomask on the wafer under an exposure condition of using the Y-dipole illumination system, and exposing the fifth photomask on the wafer under an exposure condition of using the X-dipole illumination system.

Exposing the third photomask, exposing the fourth photomask, and exposing the fifth photomask may be performed on a single resist layer coated on the wafer.

The method may further include, after separating the layout into a plurality of sub-layouts, performing optical proximity correction on the sub-layouts.

According to an aspect of the inventive concept, there is provided a method of fabricating a semiconductor device which includes preparing a layout of the semiconductor device, determining contrast of an exposure image of the layout with a crosspole illumination system, separating the layout into a plurality of sub-layouts based on the contrast of the exposure image, forming a photomask with a pattern corresponding to the plurality of sub-layouts, and exposing the photomask with a double exposure on a wafer with a dipole illumination system.

Determining the contrast of the exposure image may include calculating a ratio of a difference between maximum and minimum intensity values to a sum of the maximum and minimum intensity values in the exposure image.

Determining the contrast of the exposure image may include performing simulation of a single exposure with the crosspole illumination system.

Forming the photomask may include forming a plurality of photomasks, a number of the plurality of photomasks being smaller than a number of the plurality of sub-layouts.

Forming the plurality of photomask may include forming patterns on each photomask that correspond to at least two layouts of the plurality of layouts.

BRIEF DESCRIPTION OF THE DRAWINGS

Exemplary embodiments of the inventive concept will be more clearly understood from the following detailed description taken in conjunction with the accompanying drawings in which:

FIG. 7 illustrates a flowchart of a method for calculating contrast of an exposure image of a layout;

FIGS. 8(a) and 8(b) illustrate graphs of simulation results of the intensity of an exposure image according to the position of a layout;

DETAILED DESCRIPTION OF THE EMBODIMENTS

Figure 1:
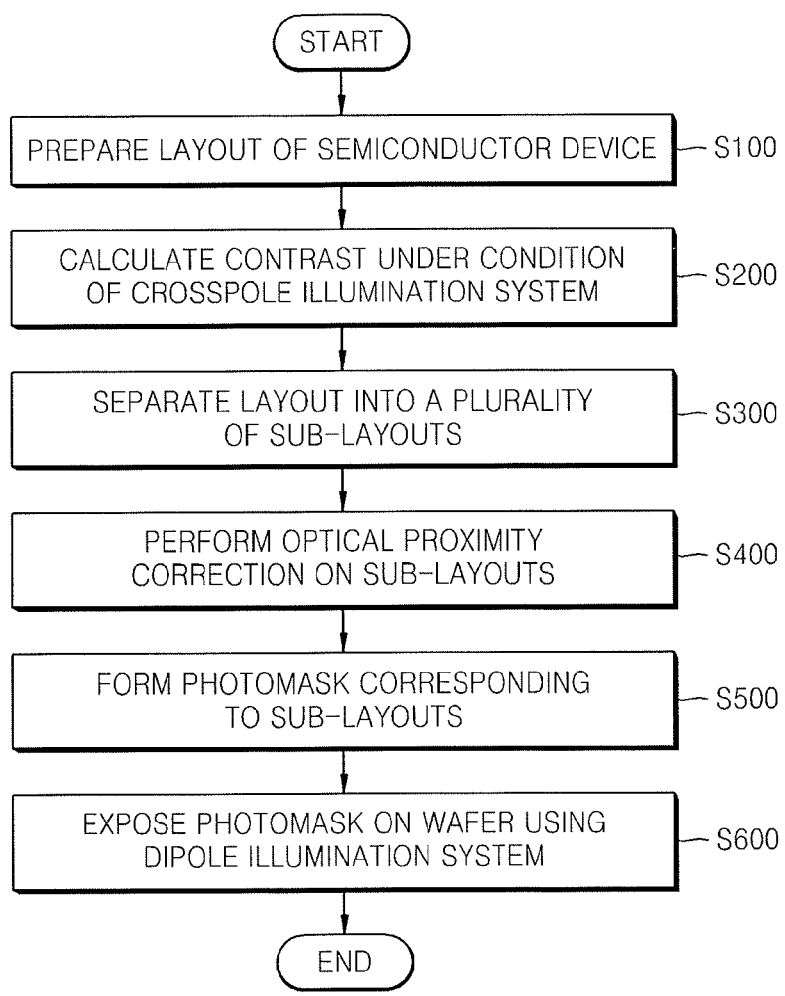
FIG. 1 illustrates a flowchart of a method for fabricating a semiconductor device according to an exemplary embodiment.

Reference will now be made in detail to exemplary embodiments, examples of which are illustrated in the accompanying drawings. However, exemplary embodiments are not limited to the embodiments illustrated hereinafter, and the embodiments herein are rather introduced to provide easy and complete understanding of the scope and spirit of exemplary embodiments. In the drawings, the thicknesses of layers and regions are exaggerated for clarity.

In the drawing figures, the dimensions of layers and regions may be exaggerated for clarity of illustration. It will also be understood that when a layer (or element) is referred to as being "on," "connected to," or "coupled to" another layer or substrate, it can be directly on, connected to, or coupled to the other layer or substrate, or intervening layers may also be present. In addition, it will also be understood that when a layer is referred to as being "between" two layers, it can be the only layer between the two layers, or one or more intervening layers may also be present. Like reference numerals refer to like elements throughout. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of exemplary embodiments.

Spatially relative terms, such as "above," "upper," "beneath," "below," "lower," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "above" may encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of exemplary embodiments. As used herein, the singular forms "a," "an" and "the" are intended to include the plural forms as well, unless the context clearly indicates otherwise. It will be further understood that the terms "comprises" and/or "comprising" when used in this specification, specify the presence of stated features, integers, steps, operations, elements, and/or components, but do not preclude the presence or addition of one or more other features, integers, steps, operations, elements, components, and/or groups thereof.

Exemplary embodiments are described herein with reference to cross-sectional illustrations that are schematic illustrations of exemplary embodiments (and intermediate structures). As such, variations from the shapes of the illustrations as a result, for example, of manufacturing techniques and/or tolerances, are to be expected. Thus, exemplary embodiments should not be construed as limited to the particular shapes of regions illustrated herein but may be to include deviations in shapes that result, for example, from manufacturing. For example, an implanted region illustrated as a rectangle may, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes may be not intended to illustrate the actual shape of a region of a device and are not intended to limit the scope of exemplary embodiments.

Unless otherwise defined, all terms (including technical and scientific terms) used herein have the same meaning as commonly understood by one of ordinary skill in the art to which exemplary embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a flowchart for explaining a method of fabricating a semiconductor device according to an exemplary embodiment of the inventive concept. Referring to FIG. 1, the method of fabricating a semiconductor device according to the present exemplary embodiment may include operations of preparing a layout of a semiconductor device (S100), obtaining contrast of an exposure image of the layout through a simulation under the exposure condition of using a crosspole illumination system (S200), separating the layout into a plurality of sub-layouts based on the obtained contrast of the exposure image (S300), performing optical proximity correction on the sub-layouts (S400), forming a photomask including a mask pattern corresponding to the sub-layouts (S500), and exposing the photomask on a wafer under the condition of using a dipole illumination system (S600). A dipole illumination system and a crosspole illumination system will be briefly described below and the operations of the method of fabricating a semiconductor device will be described as well.

In exemplary embodiments according to the present inventive concept, in order to increase resolution of a semiconductor exposure apparatus, an off-axis illumination system, in which light is asymmetrically incident with respect to an optical axis, may be used. In a conventional illumination system, light is symmetrically incident with respect to an optical axis, so a 3-beam focusing principle using the 0th, the $(+1^{st})$, and the $(-1st)$ order diffractive lights is used. In contrast, in the off-axis illumination system using a modified illumination method according to example embodiments, a 2-beam focusing principle using the 0th order diffractive light and only one, e.g., any one, of the $(+1^{st})$ and $(-1^{st})$ order diffractive lights is used. Thus, compared to the conventional illumination system, resolution and depth of focus (DOF) may be increased in the off-axis illumination system.

The off-axis illumination system may include a dipole illumination system and a crosspole illumination system according to the position of an opening portion. The dipole illumination system or the crosspole illumination system is arranged between a light source and a photomask in an exposure apparatus.

Figure 2:
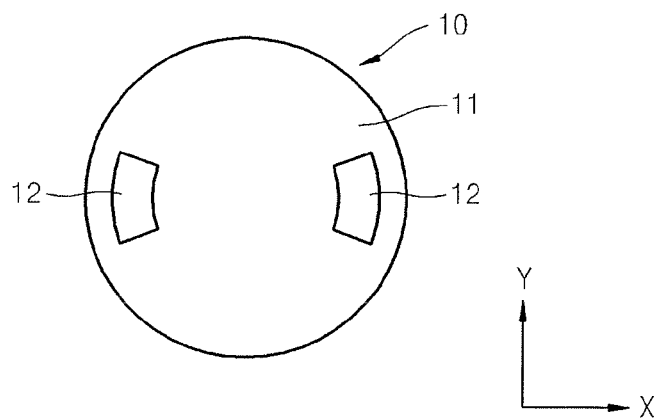
FIG. 2 illustrates a schematic plan view of an X-dipole illumination system.
Figure 3:
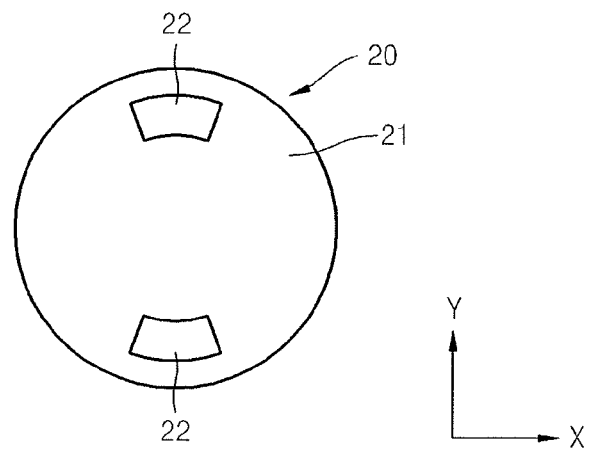
FIG. 3 illustrates a schematic plan view of a Y-dipole illumination system.
Figure 4:
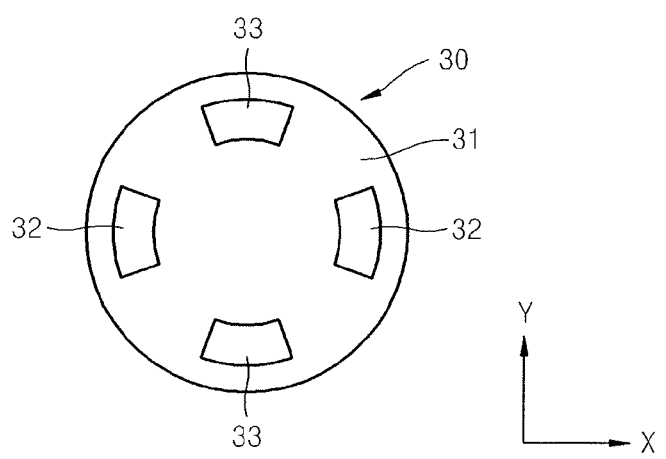
FIG. 4 illustrates a schematic plan view of a crosspole illumination system.

FIG. 2 is a plan view of an X-dipole illumination system 10. FIG. 3 is a plan view of a Y-dipole illumination system 20. FIG. 4 is a plan view of a crosspole illumination system 30.

Referring to FIG. 2, the X-dipole illumination system 10 includes a light shield area 11 and a pair of opening portions 12 arranged to face each other in an X-axis direction. Referring to FIG. 3, the Y-dipole illumination system 20 includes a light shield area 21 and a pair of opening portions 22 arranged to face each other in a Y-axis direction. Referring to FIG. 4, the crosspole illumination system 30 includes a light shield area 31, a pair of opening portions 32 arranged to face each other in the X-axis direction, and a pair of opening portions 33 arranged to face each other in the Y-axis direction. The dipole illumination system is an active off-axis illumination system that provides a superior aerial image particularly in a direction perpendicular to a dipole direction, compared to the crosspole illumination system.

Figure 5:
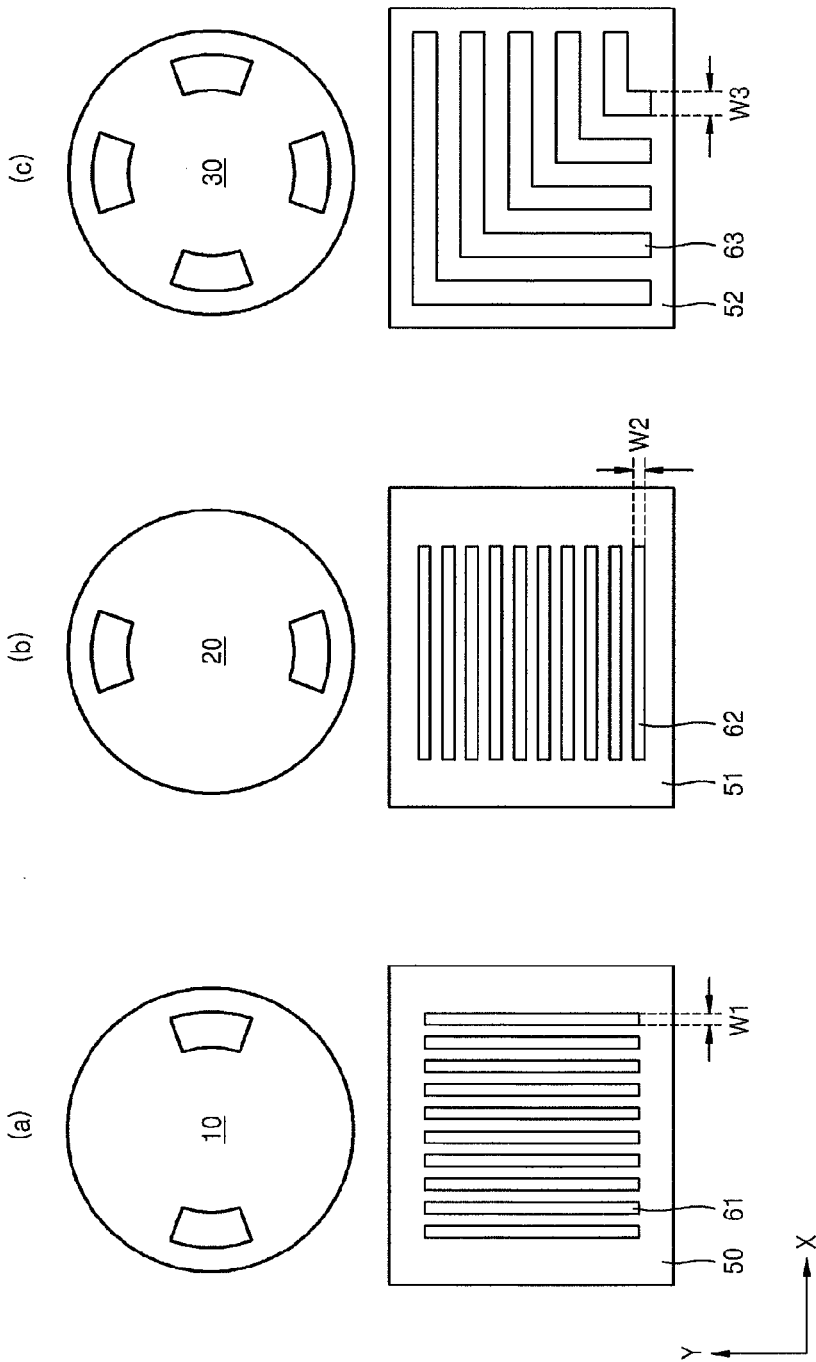
FIGS. 5(a), 5(b), and 5(c) illustrate photomask patterns with respective off-axis illumination systems embodying an optimal resolution for each photomask.

FIGS. 5(a), 5(b), and 5(c) illustrate photomask patterns with optimal resolutions corresponding to off-axis illumination systems in FIGS. 2-4, respectively. Referring to FIGS. 5(a) and 5(b), the X-dipole illumination system 10 provides an optimal resolution for a plurality of vertical lines 61 in a first photomask 50 (FIG. 5(a)) and the Y-dipole illumination system 20 provides an optimal resolution for a plurality of horizontal lines 62 in a second photomask 51 (FIG. 5(b)). However, the X-dipole illumination system 10 does not provide an optimal resolution for the horizontal lines 62 and the Y-dipole illumination system 20 does not provide an optimal resolution for the vertical lines 61. Thus, in the present exemplary embodiment, double exposure may be used to effectively image both the horizontal and vertical lines 62 and 61.

For example, when a layout of a semiconductor device of one layer is formed of a plurality of both horizontal and vertical lines, the layout may be divided into at least two regions corresponding to two masks. That is, the first photomask 50 may include the vertical lines 61 and the second photomask 51 may include the horizontal lines 62. The first photomask 50 including only the vertical lines 61 may undergo a first exposure process using the X-dipole illumination system 10, whereas the second photomask 51 including only the horizontal lines 62 may undergo a second exposure process using the Y-dipole illumination system 20. As such, two exposure processes, i.e., via the X-dipole and Y-dipole illumination systems 10 and 20, may be performed to image both vertical and horizontal lines.

In another example, when a layout of a semiconductor device of one layer is formed of a plurality of both horizontal and vertical lines, e.g., lines 63 including both vertical and horizontal portions in FIG. 5(c), may be exposed at one time, i.e., simultaneously. That is, lines 63 may be exposed by a single exposure via a single photomask 52 using the crosspole illumination system 30. However, as the crosspole illumination system 30, in which additional flare is generated, may generate deterioration in terms of image contrast compared to the double exposure, the crosspole illumination system 30 may be used when a size, e.g., width, W3 of the photomask pattern is large. When the sizes, e.g., widths, W1 and W2 of the photomask pattern are small, the X- and Y-dipole illumination systems 10 and 20 may be used.

The operations of a method of fabricating a semiconductor device according to the present exemplary embodiment will be described below. First, a layout 100 of a semiconductor device is prepared (S100).

Figure 6:
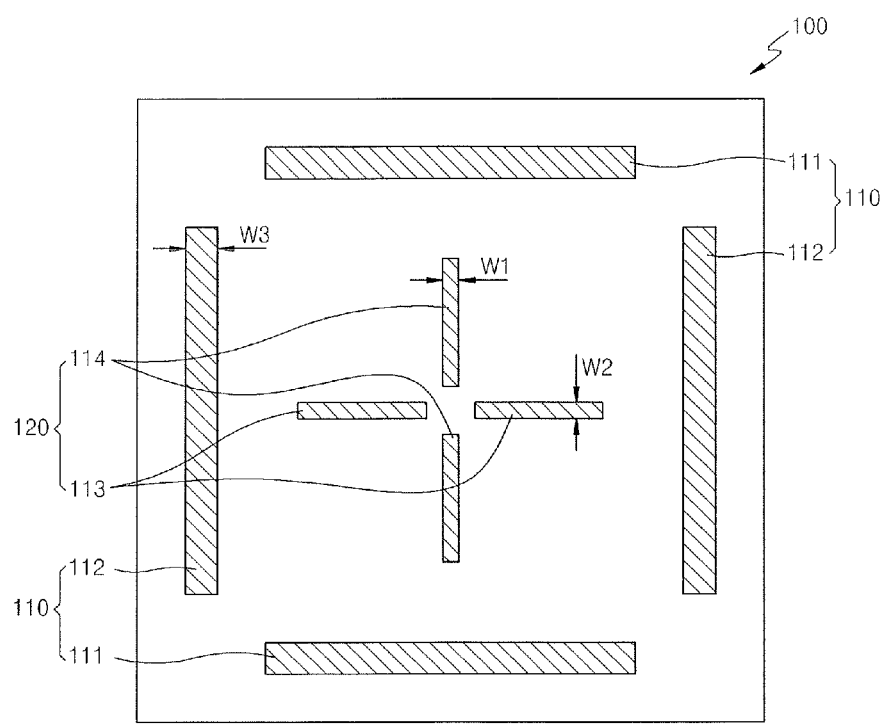
FIG. 6 illustrates an exemplary plan view of a layout of a semiconductor device.

FIG. 6 is a plan view of the layout 100 of a semiconductor device. Referring to FIG. 6, the layout of a semiconductor device may be a design layout of a semiconductor. The design layout may be used to perform a photolithography process simulation to carry out optical proximity correction (OPC) before an actual photomask is fabricated. A photomask is a mask used for fabricating various fine semiconductor devices. A fine semiconductor device may include a high integrated circuit semiconductor memory device, e.g., a DRAM, a SRAM, or a flash memory device, a processor, e.g., a central processing unit (CPU), a digital signal processor (DSP), or a combination of a CPU and a DSP, an application specific integrated circuit (ASIC), a micro electro mechanical (MEMs) device, an optoelectric device, or a display device. The photomask may be formed based on information that the design layout has. The photomask may signify an actually fabricated photomask or a photomask image formed by a simulation. Ideally, the photomask may completely deliver the information that the design layout has. However, the actual photomask may not completely deliver the information that the design layout has due to transmittance distribution.

The layout 100 of a semiconductor device may include a plurality of sub-layouts 111, 112, 113, and 114 having a variety of sizes and shapes. For example, the layout 100 of a semiconductor device may include a first sub-layout 110 and a second sub-layout 120. The first sub-layout 110 may include a horizontal sub-layout 111 having a horizontal direction and a vertical sub-layout 112 having a vertical direction. A size, e.g., a width, W3 of each of the first sub-layouts 110 may be large enough to use a crosspole illumination system. The second sub-layout 120 may include a third sub-layout 113 having a layout extending in a horizontal direction and a fourth sub-layout 114 having a layout extending in a vertical direction. A size W2 of the third sub-layout 113 and a size W2 of the fourth sub-layout 114 may be small enough to use a dipole illumination system.

Under the exposure condition of using a crosspole illumination system, contrast of an exposure image of the layout is obtained through a simulation (S200). According to the present exemplary embodiment, even when the layout 100 of a semiconductor device has a sub-layout having a small size that is not appropriate for using a crosspole illumination system, the condition of an illumination system needed for a simulation to obtain contrast of an exposure image may be set to use a crosspole illumination system.

FIG. 7 is a flowchart for explaining a method of calculating contrast of an exposure image of a layout, i.e., operation S200. First, the exposure image may be, e.g., an aerial image. An image projected by a projection imaging tool, e.g., a scanner, a stepper, or a step-and-scan tool, may be obtained through a simulation from a prepared design layout. The projected image is called an aerial image. Thus, the aerial image may be formed from the prepared design layout through a lithography process simulation. The aerial image may be described to be distribution of light intensity that is presented by a function of a spatial position in or around an image plane. That is, the aerial image projected through the design layout may have an image contrast.

However, according to the present embodiment, the exposure image is not limited to the aerial image and may be defined by a variety of parameters used in the exposure process. For example, in addition to the aerial image, the exposure image may be any one of a resist-in image, an exposed resist-in latent image, a post-exposure bake image, and a developed resist image.

The aerial image signifies an image formed in space. Thus, an image formed in resist on a wafer, i.e., a resist-in image, may be different from the aerial image. For example, the resist-in image may be formed in resist according to reflection/refraction at a boundary surface between air and resist and reflection by a wafer. That is, the resist-in image may be obtained through a simulation considering an incident angle and polarization.

The resist-in image may be different from the exposed resist-in latent image. The difference lies in a degree of transfer energy supplied by the resist-in image to the resist, i.e., sensitivity of the resist. Thus, the exposed resist-in latent image may be obtained through a simulation by reflecting the sensitivity of resist. The latent image is formed by a portion of resist that is exposed and a portion of resist that is not exposed.

When bake is performed after exposure, a change may be generated in the latent image. In particular, a different latent image may be formed according to the type of resist when bake is performed after exposure. A latent image by bake after exposure, i.e., a post-exposure bake image, may be obtained by a simulation in consideration of a chemical action of resist, e.g., reaction or diffusion, during a bake process after exposure. When a quencher is used, the post-exposure bake image may be obtained by a simulation considering the operation of the quencher.

When development is performed, the developed resist image may be different from the post-exposure bake image due to a difference in solubility of the resist. Thus, the developed resist image may be obtained by a simulation considering a difference in solubility of the resist. As such, a lithography process simulation may be performed to obtain the exposure image in consideration of a considerable physical or chemical phenomenon.

Referring to FIG. 7, a method of calculating contrast of an exposure image of a layout may include identifying a distribution of intensity of an exposure image of the layout (S210), obtaining a maximum value $I_{max}$ and a minimum value $I_{min}$ of the intensity of the exposure image (S220), and obtaining contrast of the exposure image by calculating a ratio of a difference between the maximum value and the minimum value and a sum of the maximum value and the minimum value (S230), i.e., by calculating the value of $$\left(\frac{I_{max} - I_{min}}{I_{max} + I_{min}}\right).$$

FIG. 8 illustrates graphs of simulation results of the intensity of an exposure image according to the position of a layout. Referring to FIG. 8, each graph illustrates a sum of intensity of an exposure image by first exposure and intensity of an exposure image by second exposure. That is, the intensity of an overall exposure image of double exposure includes the first exposure using an X-dipole illumination system and the second exposure using a Y-dipole illumination system, and is the same as the intensity of single exposure image using a crosspole illumination system. Thus, the double exposure process using the X-dipole illumination system and the Y-dipole illumination system and the single exposure process using the crosspole illumination system have the same intensity of an exposure image of a layout.

In the method of fabricating a semiconductor device according to the present exemplary embodiment, separating the layout into a plurality of sub-layouts based on the contrast of an exposure image (S300) may include separating the layout into a plurality of sub-layouts by comparing contrast of an exposure image of each sub-layout with a predetermined critical value under the condition of using a crosspole illumination system.

In detail, in graph (a) of FIG. 8, i.e., FIG. 8(*a*), the intensity of an overall exposure image corresponds to the intensity of an overall exposure image when single exposure is performed on the second sub-layout 120 of FIG. 6, under the condition of using a crosspole illumination system. In graph (b) of FIG. 8, i.e., FIG. 8(b), the intensity of an overall exposure image corresponds to the intensity of an overall exposure image when single exposure is performed on the first sub-layout 110 of FIG. 6, under the condition of using a crosspole illumination system.

The contrast, i.e., the ratio calculated in operation 5230 of FIG. 7, of the overall exposure image of FIG. 8(a) is lower than that of the overall exposure image of FIG. 8(b). Thus, when an appropriate critical value is set, the layout may be separated into the first sub-layout 110 of FIG. 6, in which the contrast of an exposure image is greater than the critical value, and the second sub-layout 120 of FIG. 6, in which the contrast of an exposure image is equal to or smaller than the critical value.

In the method of fabricating a semiconductor device according to the present exemplary embodiment, forming a photomask including a mask pattern corresponding to the sub-layouts, i.e., operation (S500) of FIG. 1, and exposing the photomask on a wafer under the condition of using a dipole illumination system, i.e., operation (S600) of FIG. 1, provide a variety of exemplary embodiments.

Figure 9:
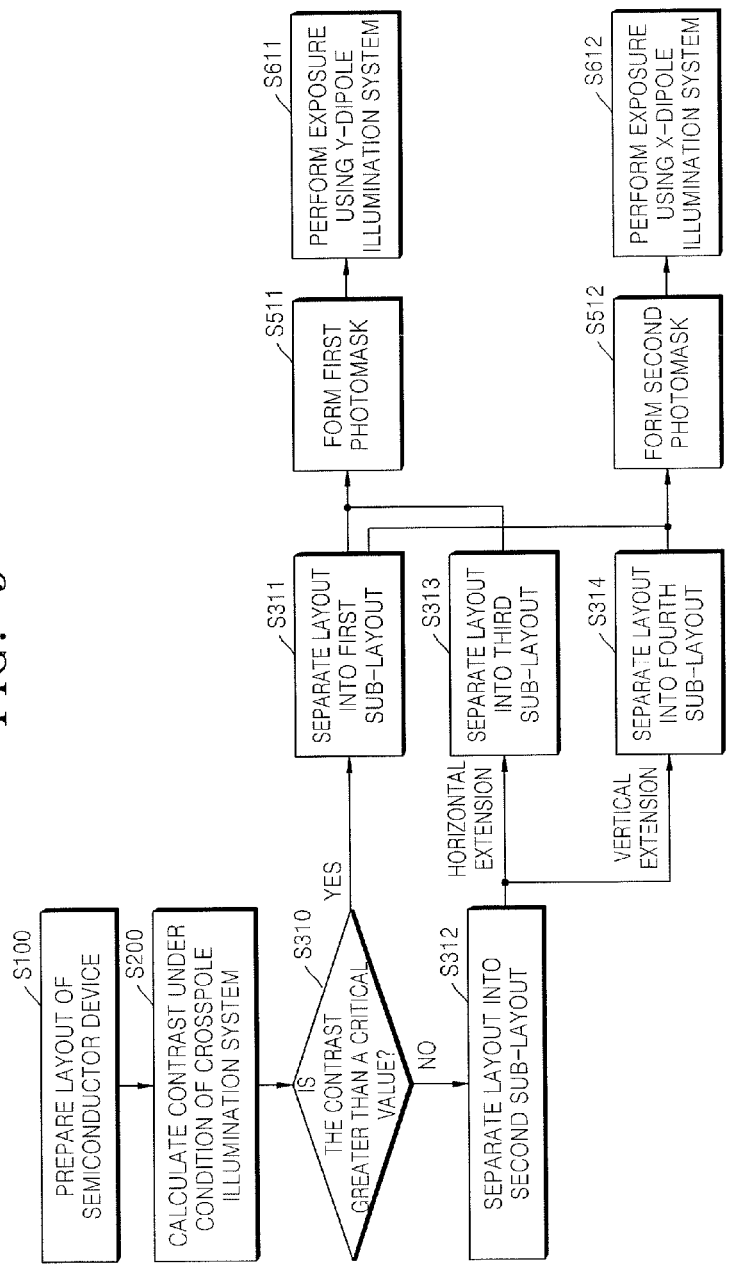
FIG. 9 illustrates a flowchart of a method for fabricating a semiconductor device according to another exemplary embodiment.
Figure 10:
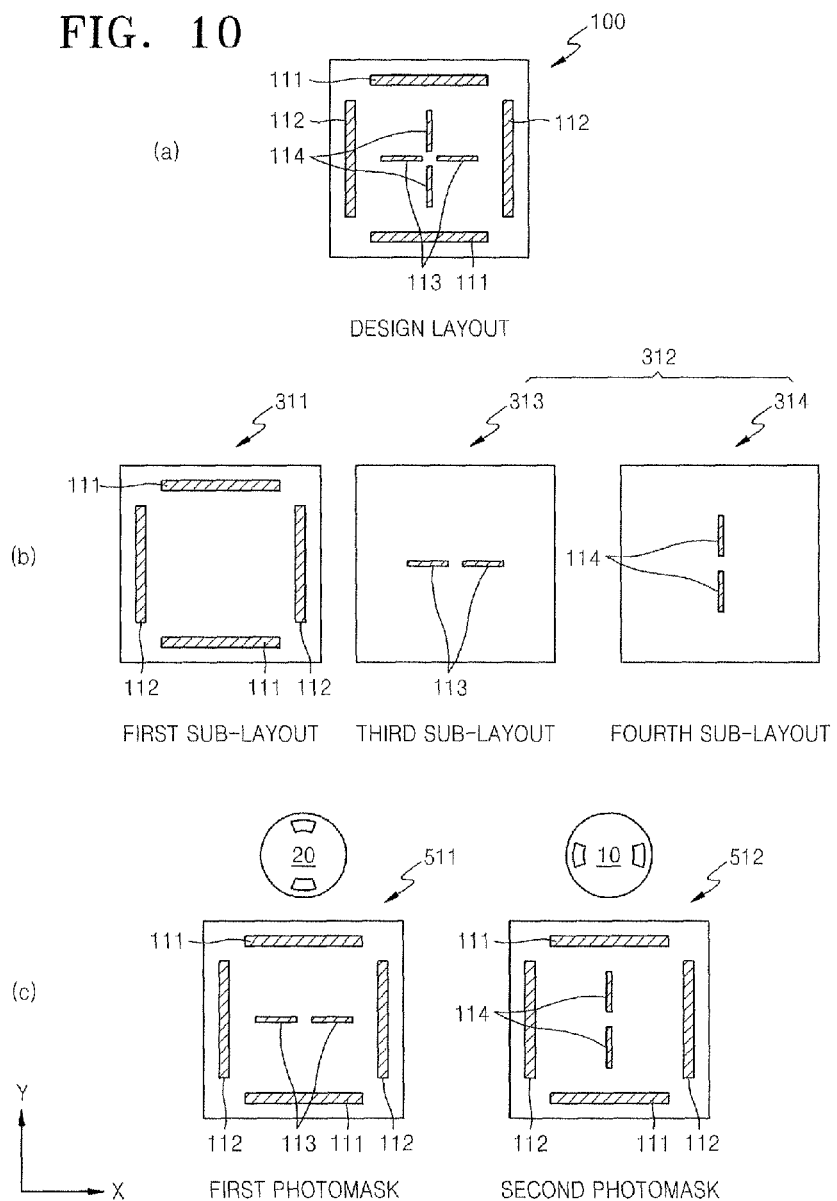
FIGS. 10(a), 10(b), and 10(c) illustrate conceptual diagrams of the method of fabricating the semiconductor device of FIG. 9.

FIG. 9 is a flowchart for explaining a method of fabricating a semiconductor device according to an exemplary embodiment of the present inventive concept. FIGS. 10(a), 10(b), and 10(c) are conceptual diagrams illustrating the method of fabricating the semiconductor device of FIG. 9. Since operations S100 and 5200 were already described above, the descriptions thereof will be omitted herein.

Referring to FIGS. 9, 10(a), 10(b), and 10(c), separating of the layout 100 of FIG. 10(a) into a plurality of sub-layouts based on contrast (S300 of FIG. 1) may include determining the contrast of an exposure image of the layout 100 in comparison with a predetermined critical value (S310). Also, by reflecting a result of the determination, i.e., in accordance with the result of operation S310, operation S300 may further include separating the layout 100 into the first sub-layout 311 (S311), e.g., when the contrast is larger than the critical value, and separating the layout 100 into the second sub-layout (S312), e.g., when the contrast is equal to or smaller than the critical value, as illustrated in FIG. 10(b).

After separating the layout 100 into the second sub-layout 312 (S312), operation S300 may further include separating the second sub-layout 312 (S312) of the layout 100 into the third sub-layout 313 (S313) to include a sub-layout extending in a horizontal direction, and separating the layout 100 into the fourth sub-layout 314 (S314) to include a sub-layout extending in a vertical direction. In other words, the different regions in the layout 100 of FIG. 10(a) may be separated into three different types of regions represented by respective three sub-layouts 311, 313, and 314 of FIG. 10(b).

Next, forming of a photomask including a mask pattern corresponding to the sub-layouts (S500) may be performed. In detail, as illustrated in FIG. 10(c), forming a first photomask 511 including first mask patterns 111', 112', and 113' corresponding to the first sub-layout 311 and the third sub-layout 313, and forming a second photomask 512 including second mask patterns 111', 112', and 114' corresponding to the first sub-layout 311 and the fourth sub-layout 314 may be performed.

Prior to forming a photomask, OPC is performed on each of the separated sub-layouts (S400 of FIG. 1) to create OPC-ed sub-layouts. A photomask may be formed by combining the OPC-ed sub-layouts in the same manner as that described above.

Next, exposing the photomask on a wafer using a dipole illumination system (S600 of FIG. 1) may be performed. In detail, the first photomask 511 including the first mask patterns 111', 112', and 113' corresponding to the first sub-layout 311 and the third sub-layout 313 may be exposed using the Y-dipole illumination system 20 (S611), and the second photomask 512 including the second mask patterns 111', 112', and 114' corresponding to the first sub-layout 311 and the fourth sub-layout 314 may be exposed using the X-dipole illumination system 10 (S612).

As a result, two photomasks may be formed by combining the separated plurality of sub-layouts of the layout 100, and exposure may be performed once for each photomask using a dipole illumination system. Since the first sub-layout 311 is included in both of the first and second photomasks 511 and 512, the same effect as that of the single exposure by the crosspole illumination system 30 may be obtained. Since the third sub-layout 313 is included in the first photomask 511 only, exposure may be performed using the Y-dipole illumination system 20. Since the fourth sub-layout 314 is included in the second photomask 512 only, exposure may be performed using the X-dipole illumination system.

Although in the present exemplary embodiment an actual exposure process is performed using a dipole illumination system such as the X-dipole illumination system and the Y-dipole illumination system (S611 and S612), a layout may be separated by one-time simulation because the simulation on a layout into sub-layouts (S200) is performed under the conduction of using a crosspole illumination system. If the simulation of separating a layout into sub-layouts is performed under the condition of using an X-dipole illumination system and a Y-dipole illumination system, a total of two times of simulation, i.e., one by the X-dipole illumination system and the other by the Y-dipole illumination system, thereby resulting in a relatively long simulation time.

As described above, the first sub-layout 311 undergoes double exposure and each of the third and fourth sub-layouts 313 and 314 undergoes single exposure. That is, the resist on a wafer corresponding to the first sub-layout 311 undergoes double exposure, the resist on the wafer corresponding to the third sub-layout 313 undergoes single exposure, and the resist on the wafer corresponding to the fourth sub-layout 314 undergoes single exposure.

Figure 11:
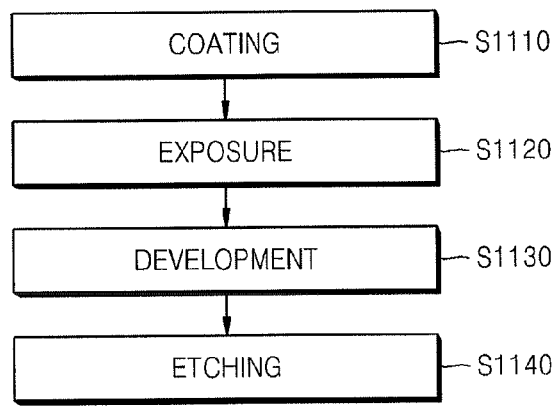
FIG. 11 illustrates a flowchart for explaining single exposure.
Figure 12:
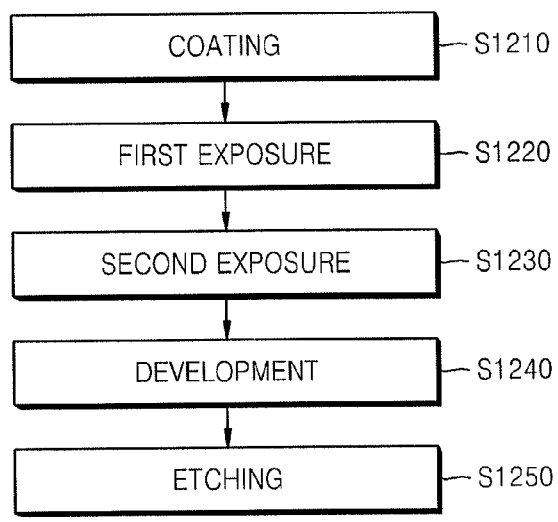
FIG. 12 illustrates a flowchart for explaining an example of double exposure.
Figure 13:
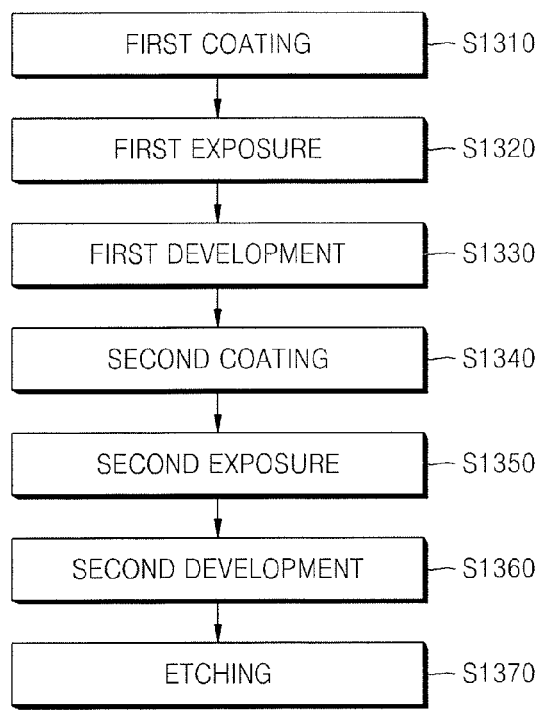
FIG. 13 illustrates a flowchart for explaining another example of double exposure.

FIG. 11 is a flowchart for explaining single exposure. FIG. 12 is a flowchart for explaining an example of double exposure. FIG. 13 is a flowchart for explaining another example of double exposure.

Referring to FIG. 11, in the single exposure of the third sub-layout 313, a resist layer is coated on a wafer (S1110), single exposure is performed on the resist layer using the first photomask 511 under the condition of using the Y-dipole illumination system 20 (S1120), the resist layer is developed using a developing solution (S1130) and a developed resist layer is patterned, and the wafer is etched using a patterned resist layer as a mask (S1140). Similarly, in the single exposure of the fourth sub-layout 314, a resist layer is coated on a wafer (S1110), single exposure is performed on the resist layer using the second photomask 512 under the condition of using the X-dipole illumination system 10 (S1120), the resist layer is developed using a developing solution (S1130) and a developed resist layer is patterned, and the wafer is etched using a patterned resist layer as a mask (S1140).

Referring to FIG. 12, in a double exposure of the first sub-layout 311, a resist layer is coated on the wafer (S1210), first exposure is performed on the resist layer using the first photomask 511 under the condition of using the Y-dipole illumination system 20 (S1220), i.e., to form the horizontal sub-layout 111, second exposure is performed on the same resist layer using the second photomask 512 under the condition of using the X-dipole illumination system 10 (S1230), i.e., to form the vertical sub-layout 111, the resist layer is developed using a developing solution (S1240) and a developed resist layer is patterned, and the wafer is etched using a patterned resist layer as a mask (S1250). The exposure process of FIG. 12 includes a double exposure, i.e., two single exposure processes, performed on the same resist layer. Thus, a fabrication process including two single exposure processes may be relatively simple and may have a low cost, despite potential low image contrast and loss of a resist layer.

Referring to FIG. 13, in another example of double exposure of the first sub-layout 311, a first resist layer is coated on the wafer (S1310), first single exposure is performed on the first resist layer using the first photomask 511 under the condition of using the Y-dipole illumination system 20 (S1320), the first resist layer is developed using a developing solution (S1330), a second resist layer is coated on the wafer (S1340), second single exposure is performed on the second resist layer using the second photomask 512 under the condition of using the X-dipole illumination system 10 (S1350), the second resist layer is developed using a developing solution (S1360), and the wafer is etched using patterned first and second resist layers as a mask (S1370).

Although it is not illustrated in the drawings, a freezing process may be used with respect to the patterned first resist layer after developing the first resist layer using a developing solution (S1330). The freezing process is to form a protection layer to prevent the patterned first resist layer from being damaged by the subsequent second resist related process. The exposure process of FIG. 13 does not include performing an exposure process twice on the same resist layer but a single exposure process for each resist layer, thereby increasing image contrast and minimizing loss of a resist layer. It is noted, however, that he fabrication process may be relatively complicated and fabrication costs may be high.

Figure 14:
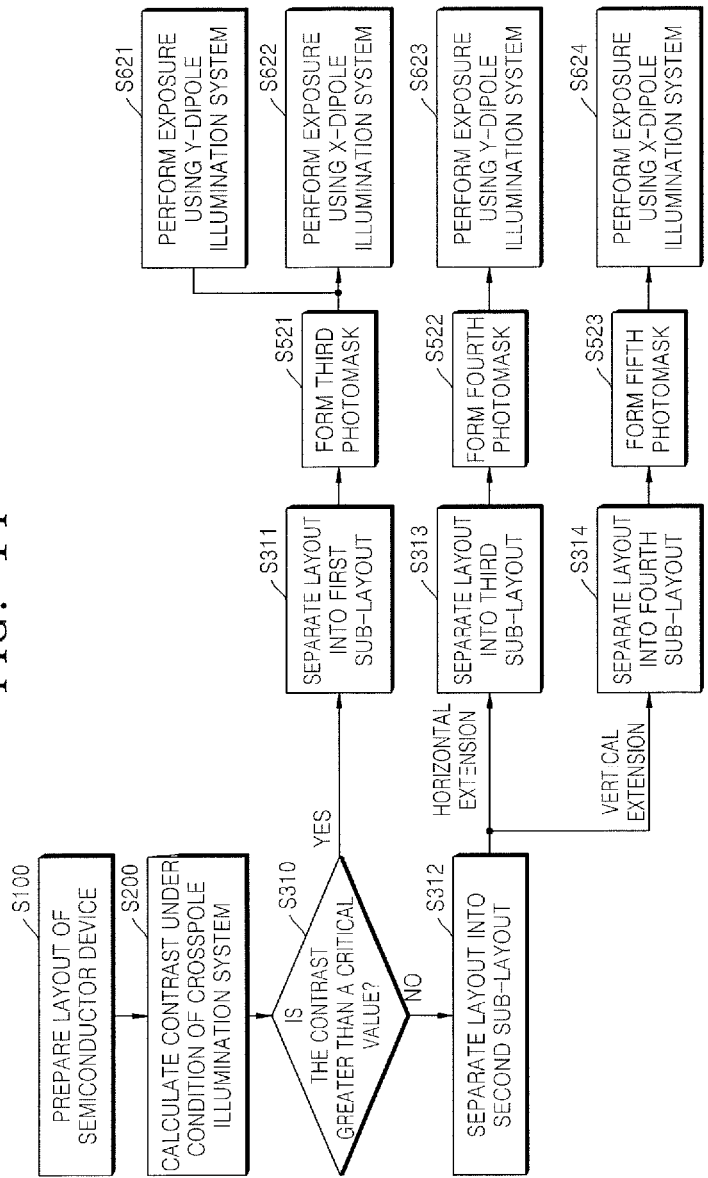
FIG. 14 illustrates a flowchart of a method for fabricating a semiconductor device according to another exemplary embodiment.
Figure 15:
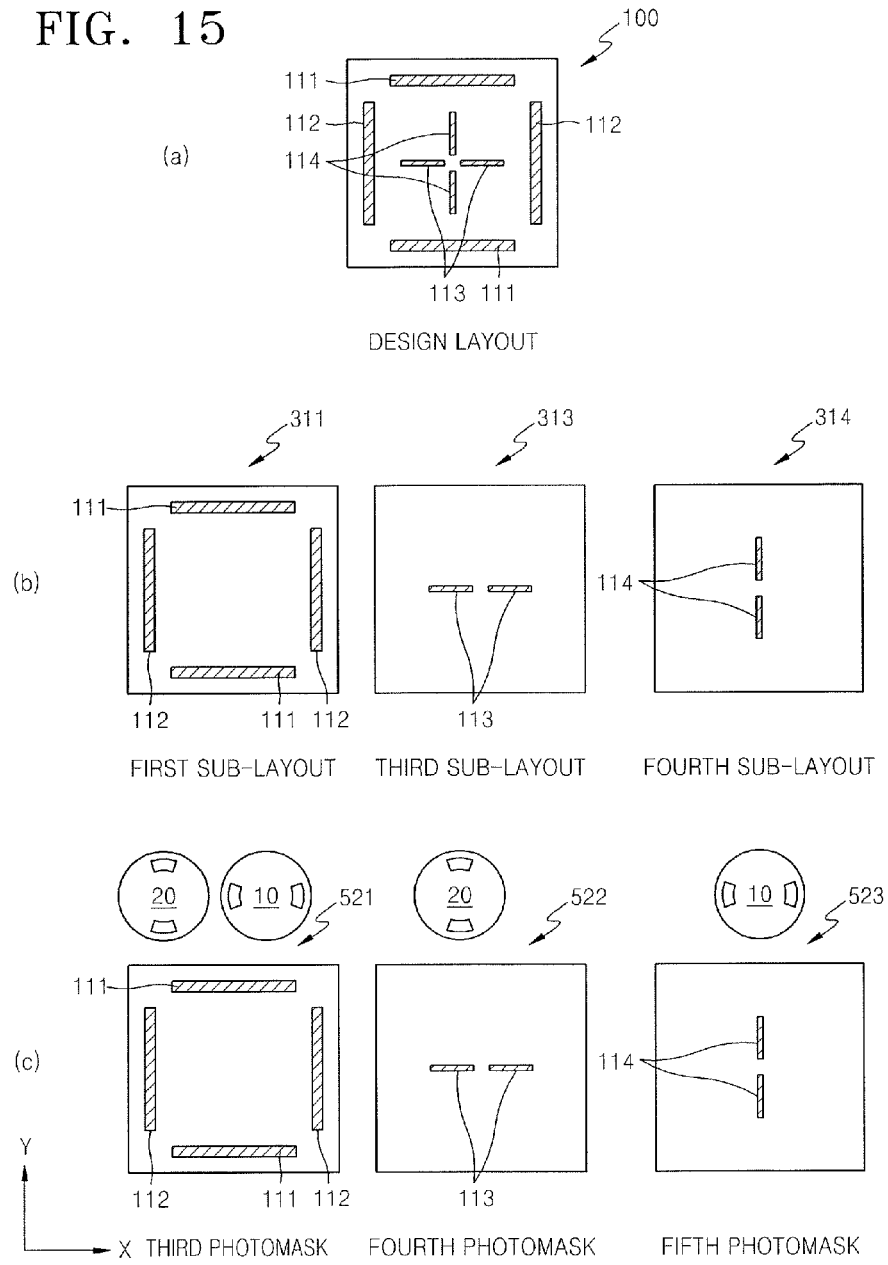
FIGS. 15(a), 15(b), and 15(c) illustrate conceptual diagrams illustrating the method of fabricating the semiconductor device of FIG. 14.

FIG. 14 is a flowchart for explaining a method of fabricating a semiconductor device according to another exemplary embodiment of the present inventive concept. FIGS. 15(a), 15(b), and 15(c) are conceptual diagrams illustrating the method of fabricating a semiconductor device of FIG. 14. Since the operations S100 and S200 are already described above, the descriptions thereof will be omitted herein. Also, since the operations S310, S311, S312, S313, and S314 are already described above, the descriptions thereof will be omitted herein.

Referring to FIGS. 14, 15(a), 15(b), and 15(c), forming of a photomask (S500 of FIG. 1) is performed. In detail, a third photomask 521 including third mask patterns 111' and 112' corresponding to the first sub-layout 311 is formed (S521), a fourth photomask 522 including a fourth mask pattern 113' corresponding to the third sub-layout 313 is formed (S522), and a fifth photomask 523 including a fifth mask pattern 114' corresponding to the fourth sub-layout 314 is formed (S523).

Prior to forming a photomask, OPC may be performed on each of the separated sub-layouts (S400 of FIG. 1) to create OPC-ed sub-layouts. A photomask may be formed by combining the OPC-ed sub-layouts in the same manner as that described above.

Next, exposing of the photomask on a wafer using a dipole illumination system (S600 of FIG. 1) may be performed. In detail, the third photomask 521 including the third mask patterns 111' and 112' corresponding to the first sub-layout 311 may be exposed using the Y-dipole illumination system 20 (S621) or using the X-dipole illumination system 10 (S622). The fourth photomask 522 including the fourth mask patterns 113' corresponding to the third sub-layout 313 may be exposed using the Y-dipole illumination system 20 (S623).

The fifth photomask 523 including the fifth mask pattern 114' corresponding to the fourth sub-layout 314 may be exposed using the X-dipole illumination system 10 (S624).

Exposing of the third photomask 521 (S621 and S622), exposing of the fourth photomask 522 (S623), and exposing of the fifth photomask 523 (S624) may be performed on one resist layer coated on the wafer. However, the technical concept of the present inventive concept is not limited thereto. A plurality of resist layers may be formed, and any one of the operations S621, S622, S623, and S624 may be performed on any one of the resist layers.

While the first sub-layout 311 undergoes double exposure, the third and fourth sub-layouts 313 and 314 undergo single exposure. That is, the resist on the wafer corresponding to the first sub-layout 311 undergoes double exposure, the resist on the wafer corresponding to the third sub-layout 313 undergoes single exposure, and the resist on the wafer corresponding to the fourth sub-layout 314 undergoes single exposure.

In the present exemplary embodiment, three photomasks are formed by combining the separated sub-layouts and four times of exposure are performed. Consequently, one or two times of exposure is performed for each photomask using a dipole illumination system. The first sub-layout 311 undergoes double exposure by the Y-dipole illumination system 20 and the X-dipole illumination system 10, which generates the same effect as that generated by single exposure by the crosspole illumination system 30. The third sub-layout 313 is exposed by the Y-dipole illumination system 20. The fourth sub-layout 314 is exposed by the X-dipole illumination system 10.

In the exemplary embodiment of FIG. 9, the separated sub-layouts are formed by two photomasks and two times of exposure. In the exemplary embodiment of FIG. 14, the separated sub-layouts are formed by three photomasks and four times of exposure. When a size of the third mask patterns 111' and 112' corresponding to the first sub-layout 311 in a photomask is relatively high, a loading effect may be generated in a subsequent process. Thus, to prevent the generation of a loading effect, use of a photomask on which the third mask patterns 111' and 112' only are formed may be advantageous. That is, as in the exemplary embodiment of FIG. 9, when the first sub-layout 311 and the third sub-layout 313 are arranged on the same photomask, or the first sub-layout 311 and the fourth sub-layout 314 are arranged on the same photomask, reliability of formation of a pattern corresponding to the third sub-layout 313 or the fourth sub-layout 314 may be deteriorated due to the loading effect.

It is noted that in the present exemplary embodiment an actual exposure process is performed using a dipole illumination system, such as an X-dipole illumination system and a Y-dipole illumination system (S621, S622, S623, and S624). However, separation of a layout into sub-layouts, i.e., operation (S300), may be performed by one-time simulation, i.e., under the condition of using a crosspole illumination system, to reduce simulation time. In contrast, if simulation of separating a layout into sub-layouts is performed under the condition of using the X-dipole illumination system and the Y-dipole illumination system, i.e., performing simulation a total of two times, the entire simulation may have a relatively long time.

Figure 16:
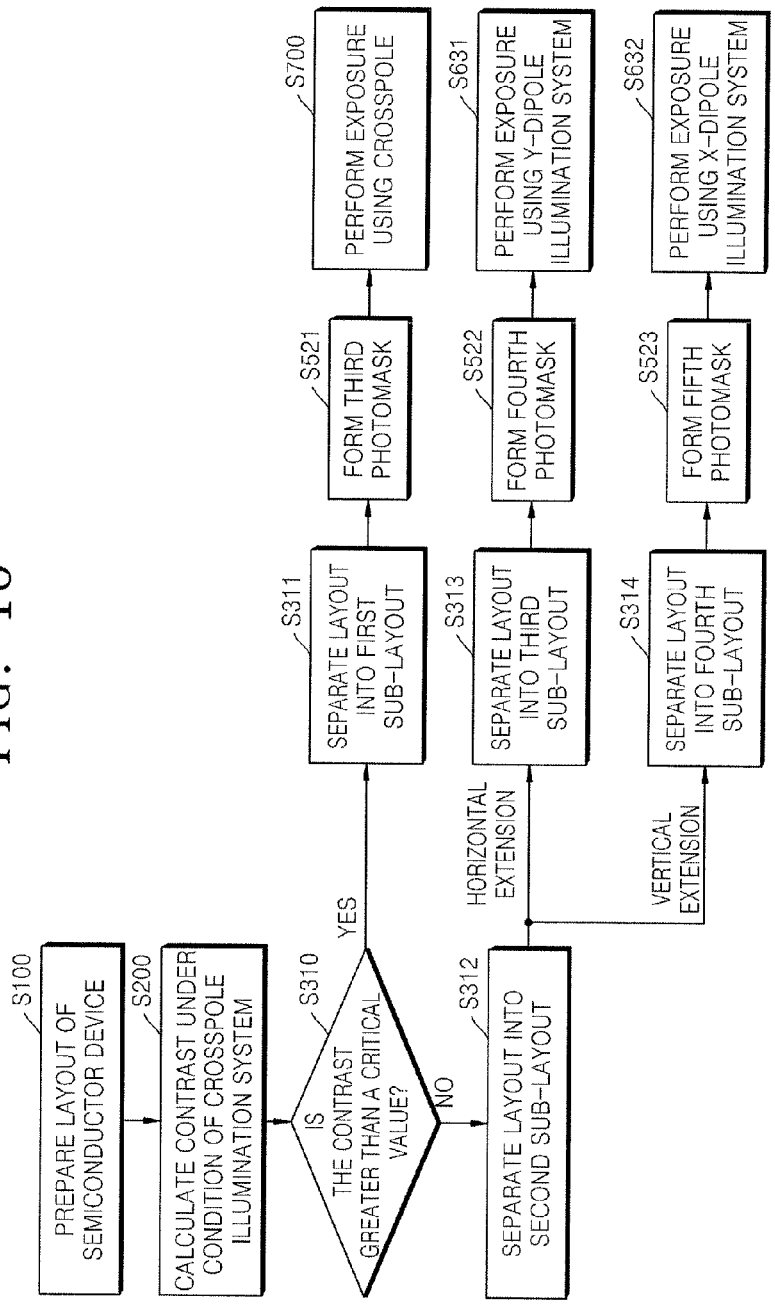
FIG. 16 illustrates a flowchart of a method for fabricating a semiconductor device according to another exemplary embodiment.
Figure 17:
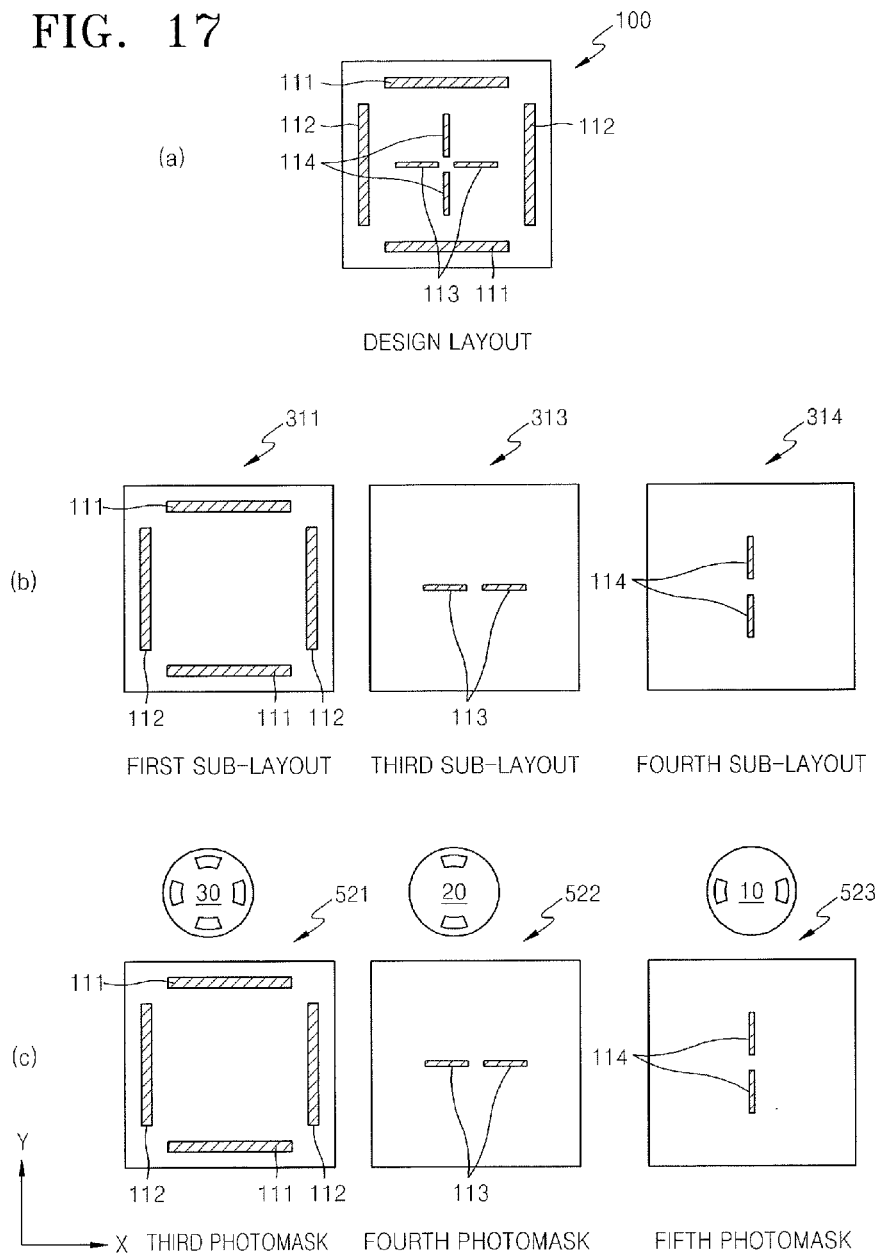
FIGS. 17(a), 17(b), and 17(c) illustrate conceptual diagrams of the method of fabricating the semiconductor device of FIG. 16.

FIG. 16 is a flowchart for explaining a method of fabricating a semiconductor device according to another exemplary embodiment of the present inventive concept. FIGS. 17(a), 17(b), and 17(c) are conceptual diagrams illustrating the method of fabricating a semiconductor device of FIG. 16. Since the operations S100 and S200 are already described above, the descriptions thereof will be omitted herein. Also, since the operations S310, S311, S312, S313, and S314 are already described above, the descriptions thereof will be omitted herein.

Referring to FIGS. 16, 17(a), 17(b), and 17(c), forming of a photomask (S500 of FIG. 1) may be performed. In detail, a third photomask 521 including third mask patterns 111' and 112' corresponding to the first sub-layout 311 is formed (S521), a fourth photomask 522 including a fourth mask pattern 113' corresponding to the third sub-layout 313 is formed (S522), and a fifth photomask 523 including a fifth mask pattern 114' corresponding to the fourth sub-layout 314 is formed (S523).

Prior to forming a photomask, OPC may be performed on each of the separated sub-layouts (S400 of FIG. 1) to create OPC-ed sub-layouts. A photomask may be formed by combining the OPC-ed sub-layouts in the same manner as that described above.

Next, exposing the photomask on a wafer using a crosspole illumination system and a dipole illumination system may be performed. In detail, the third photomask 521 including the third mask patterns 111' and 112' corresponding to the first sub-layout 311 may be exposed using the crosspole illumination system 30 (S700). The fourth photomask 522 including the fourth mask patterns 113' corresponding to the third sub-layout 313 may be exposed using the Y-dipole illumination system 20 (S631). The fifth photomask 523 including the fifth mask pattern 114' corresponding to the fourth sub-layout 314 may be exposed using the X-dipole illumination system 10 (S632).

The exposing of the third photomask 521 (S700), the exposing of the fourth photomask 522 (S631), and the exposing of the fifth photomask 523 (S632) may be performed on one resist layer coated on the wafer. However, the technical concept of the present inventive concept is not limited thereto. A plurality of resist layers may be formed, and any one of the operations S700, S631, and S632 may be performed on any one of the resist layers.

While the first sub-layout 311 undergoes single exposure, the third and fourth sub-layouts 313 and 314 undergo single exposure as well. That is, the resist on the wafer corresponding to the first sub-layout 311 undergoes single exposure by the crosspole illumination system 30, the resist on the wafer corresponding to the third sub-layout 313 undergoes single exposure by the Y-dipole illumination system 20, and the resist on the wafer corresponding to the fourth sub-layout 314 undergoes single exposure by the X-dipole illumination system 10.

In the present exemplary embodiment, three photomasks are formed by combining the separated sub-layouts and one-time exposure is performed on each photomask using the crosspole illumination system or the dipole illumination system.

Although in the exemplary embodiment of FIG. 9 the separated sub-layouts are formed by two photomasks and two times of exposure, in the exemplary embodiment of FIG. 16, the separated sub-layouts are formed by three photomasks and three times of exposure. Thus, compared to the exemplary embodiment of FIG. 9, while the exemplary embodiment of FIG. 16 may have a more complicated fabrication method and higher fabrication costs, image contrast may be improved and loss of a resist layer may be reduced. Further, when a size of the third mask patterns 111' and 112' corresponding to the first sub-layout 311 in a photomask is relatively high, a loading effect may be generated in a subsequent process. Thus, to prevent the generation of a loading effect, use of a photomask on which the third mask patterns 111' and 112' only are formed may be advantageous. That is, as in the exemplary embodiment of FIG. 9, when the first sub-layout 311 and the third sub-layout 313 are arranged on the same photomask, or the first sub-layout 311 and the fourth sub-layout 314 are arranged on the same photomask, reliability of formation of a pattern corresponding to the third sub-layout 313 or the fourth sub-layout 314 may be improved.

According to the present exemplary embodiment, while the loading effect is prevented, the frequency of exposure is reduced compared to the exemplary embodiment of FIG. 14. Therefore, the fabrication method may be relatively simplified and low fabrication costs may be expected.

Although in the present exemplary embodiment an actual exposure process is performed using a crosspole illumination system and a dipole illumination system (S700, S631, and S632), a layout may be separated by one-time simulation, i.e., under the condition of a crosspole illumination system, to reduce simulation time, e.g., as compared to two simulation via the X-dipole and Y-dipole illumination systems.

Figure 18:
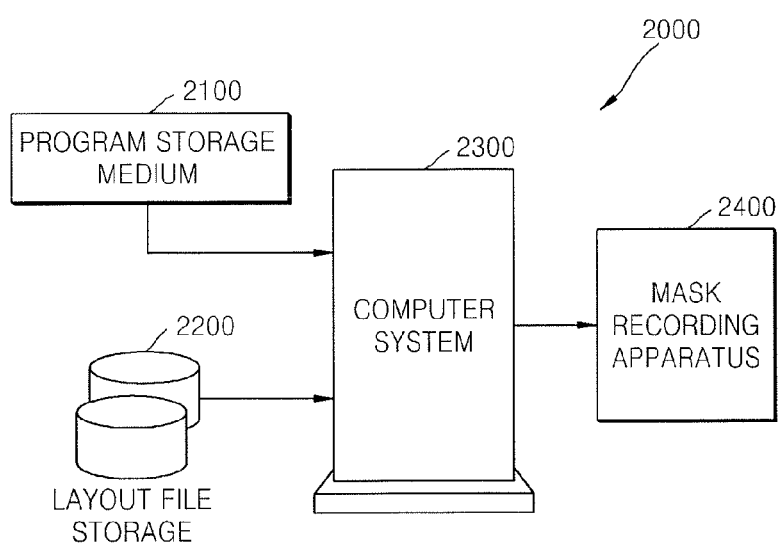
FIG. 18 illustrates a schematic diagram of a system preparing a layout of a semiconductor device, obtaining contrast of an exposure image, and separating the layout into sub-layouts, according to an exemplary embodiment.

FIG. 18 schematically illustrates a system 2000 of performing operations of preparing a layout of a semiconductor device, obtaining contrast of an exposure image, and separating the layout into sub-layouts, according to an exemplary embodiment of the present inventive concept. Referring to FIG. 18, the system 2000 according to the present exemplary embodiment may be a computer system 2300, such as a general computer or a workstation, that performs operations of preparing a layout of a semiconductor device, obtaining contrast of an exposure image, and separating the layout into sub-layouts. The computer system 2300 may be a stand along or network type, may include a single or multi-processor for calculation, and may be a parallel processing computer system.

The computer system 2300 performs a series of executable commands recorded on a program storage medium 2100, e.g., a compact disc (CD) or a digital video disc (DVD), or transferred through a wired or wireless communications network such as the Internet. The computer system 2300 receives a file containing information on a layout from a layout file storage 2200, e.g., a database or other storage medium, and performs a command to read out the information.

The computer system 2300 performs the operations of obtaining contrast of an exposure image of a layout and separating the layout into sub-layouts according to an exemplary embodiment of the present inventive concept, and then, generates a file containing information on the processing. Next, after confirming whether a desired target layout is formed through a comparison and verification operation, the computer system 2300 transfers the target layout to a mask recording apparatus 2400 so that a photomask or a reticle is fabricated.

The system 2000 may include a mechanism of preparing a layout of a semiconductor device, a mechanism of obtaining contrast of an exposure image of the layout through a simulation under the condition of using a crosspole illumination system, and a mechanism of separating the layout into sub-layouts based on the contrast of the exposure image.

The invention can also be embodied as computer readable codes on a computer readable recording medium. The computer readable recording medium is any data storage device that can store data which can be thereafter read by a computer system. Examples of the computer readable recording medium include read-only memory (ROM), random-access memory (RAM), CD-ROMs, magnetic tapes, floppy disks, optical data storage devices, etc. The computer readable recording medium can also be distributed over network coupled computer systems so that the computer readable code is stored and executed in a distributed fashion.

The programs or codes stored in the recording medium are presented by a series of instructing commands that are directly or indirectly used in an apparatus, such as a computer, having information processing ability to obtain a specific result. Thus, the term "computer" is used to collectively signify all apparatuses, regardless of any actually used name thereof, including a memory, an input/output device, and an operation device and having information processing ability to perform a particular function by a program.

The storage medium may store programmed commands that are used to perform, on a computer, each of the operations of a method including preparing a layout of a semiconductor device, obtaining contrast of an exposure image of the layout through a simulation under the condition of using a crosspole illumination system, and separating the layout into a plurality of sub-layouts based on the contrast of the exposure image.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A method of fabricating a semiconductor device, the method comprising:
   preparing a layout of the semiconductor device;
   obtaining contrast of an exposure image of the layout through a simulation under a condition of using a crosspole illumination system;
   wherein obtaining contrast of the exposure image of the layout through the simulation includes performing under a single exposure condition using the crosspole illumination system without a photomask;
   separating the layout into a plurality of sub-layouts based on the contrast of the exposure image;
   forming a photomask with a mask pattern corresponding to the plurality of sub-layouts; and
   exposing the photomask on a wafer under an exposure condition of using a dipole illumination system.

2. The method as claimed in claim 1, wherein obtaining contrast of the exposure image of the layout through the simulation includes:
   obtaining a distribution of intensity of the exposure image of the layout without use of phase shifting;
   obtaining a maximum value and a minimum value of the intensity of the exposure image; and
   obtaining a ratio of a difference between the maximum value and the minimum value to a sum of the maximum value and the minimum value.

3. The method as claimed in claim 2, wherein obtaining contrast of the exposure image includes using as the exposure image any one of an aerial image, a resist-in image, an exposed resist-in latent image, a post-exposure bake image, and a developed resist image.

4. The method as claimed in claim 1, wherein exposing the photomask on the wafer includes performing under a double exposure condition using the dipole illumination system.

5. The method as claimed in claim 1, wherein separating the layout into a plurality of sub-layouts includes separating the layout into a first sub-layout and a second sub-layout, such that the contrast of the exposure image is greater than a critical value in the first sub-layout and the contrast of the exposure image is smaller than the critical value in the second sub-layout.

6. The method as claimed in claim 5, wherein separating the layout into the plurality of sub-layouts further comprises separating the second sub-layout into a third sub layout and a fourth sub-layout, such that the third sub-layout includes a sub-layout extending in a horizontal direction and the fourth sub-layout includes a sub-layout extending in a vertical direction.

7. The method as claimed in claim 6, wherein forming the photomask includes:
   forming a first photomask to include a first mask pattern corresponding to the first sub-layout and the third sub-layout; and
   forming a second photomask to include a second mask pattern corresponding to the first sub-layout and the fourth sub-layout.

8. The method as claimed in claim 7, wherein exposing the photomask on the wafer includes:
   exposing the first photomask on the wafer under an exposure condition of using a Y-dipole illumination system; and
   exposing the second photomask on the wafer under an exposure condition of using an X-dipole illumination system.

9. The method as claimed in claim 8, wherein exposing the photomask on the wafer includes:
   coating a resist layer on the wafer;
   exposing the first photomask on the resist layer under an exposure condition of using the Y-dipole illumination system;
   exposing the second photomask on the resist layer under an exposure condition of using the X-dipole illumination system; and
   developing the resist layer that is exposed using the first and second photomasks.

10. The method as claimed in claim 9, wherein exposing the photomask on the wafer includes:
    coating a first resist layer on the wafer;
    exposing the first photomask on the first resist layer under an exposure condition of using the Y-dipole illumination system;
    developing the first resist layer that is exposed using the first photomask;
    coating a second resist layer on the wafer;
    exposing the second photomask on the second resist layer under an exposure condition of using the X-dipole illumination system;
    developing the second resist layer that is exposed using the second photomask.

11. The method as claimed in claim 8, wherein forming a photomask includes:
    forming a third photomask including a third mask pattern corresponding to the first sub-layout;
    forming a fourth photomask including a fourth mask pattern corresponding to the third sub-layout; and
    forming a fifth photomask including a fifth mask pattern corresponding to the fourth sub-layout.

12. The method as claimed in claim 11, wherein exposing the photomask on the wafer includes:
    exposing the third photomask on the wafer under an exposure condition of using the X-dipole illumination system and the Y-dipole illumination system;
    exposing the fourth photomask on the wafer under an exposure condition of using the Y-illumination system; and
    exposing the fifth photomask on the wafer under an exposure condition of using the X-dipole dipole illumination system.

13. The method as claimed in claim 12, wherein exposing the third photomask, exposing the fourth photomask, and exposing the fifth photomask are performed on a single resist layer coated on the wafer.

14. The method as claimed in claim 1, further comprising, after separating the layout into a plurality of sub-layouts, performing optical proximity correction on the sub-layouts.

15. A method of fabricating a semiconductor device, the method comprising:
- preparing a layout of the semiconductor device;
- determining contrast of an exposure image of the layout with a crosspole illumination system; wherein determining contrast of the exposure image of the layout is through a simulation process that includes performing simulation under a single exposure condition using the crosspole illumination system without a photomask;
- separating the layout into a plurality of sub-layouts based on the contrast of the exposure image;
- forming a photomask with a pattern corresponding to the plurality of sub-layouts; and
- exposing the photomask with a double exposure on a wafer with a dipole illumination system.

16. The method as claimed in claim 15 wherein determining the contrast of the exposure image includes calculating a ratio of a difference between maximum and minimum intensity values to a sum of the maximum and minimum intensity values in the exposure image.

17. The method as claimed in claim 15, wherein determining the contrast of the exposure image includes performing simulation of the single exposure with the crosspole illumination system without a phase-shifting photomask.

18. The method as claimed in claim 15, wherein forming the photomask includes forming a plurality of photomasks, a number of the plurality of photomasks being smaller than a number of the plurality of sub-layouts.

19. The method as claimed in claim 18, wherein forming the plurality of photomask includes forming patterns on each photomask that correspond to at least two layouts of the plurality of layouts.

* * * * *